US005862231A

United States Patent [19]

Tokuhisa

[11] Patent Number: 5,862,231

[45] Date of Patent: Jan. 19, 1999

[54] DSP PROGRAMMING APPARATUS AND DSP DEVICE

[75] Inventor: Hideyuki Tokuhisa, Hamamatsu, Japan

[73] Assignee: Yamaha Corporation, Hamamatsu, Japan

[21] Appl. No.: 433,090

[22] Filed: May 3, 1995

[30] Foreign Application Priority Data

May 6, 1994 [JP] Japan .................................... 6-094208

[51] Int. Cl.[6] ...................................................... H03G 3/00

[52] U.S. Cl. ................................ 381/61; 381/63; 84/602

[58] Field of Search .......................... 381/61, 62; 84/602, 84/607

[56] References Cited

U.S. PATENT DOCUMENTS 5,331,111 7/1994 O'Connell ................................ 84/602

5,410,603 4/1995 Ishiguro et al. .......................... 381/61

5,539,896 7/1996 Lisle ...................................... 395/477

*Primary Examiner*—Forester W. Isen

*Attorney, Agent, or Firm*—Pillsbury Madison & Sutro LLP

[57] ABSTRACT

A DSP programming apparatus capable not only of reducing work load for software engineers at the time of doing DSP programming but also of modularizing commonly usable algorithms, as well as to provide a DSP device capable of storing programs prepared by the DSP programming apparatus. A module storage unit stores a plurality of modules on a function basis in advance, and modules are linked by combining on a display screen through a GUI (graphical user interface) function by an input section. The linked DSP programs are converted into a DSP microprogram in executable form by a microprogram preparing section, and the microprogram is then transferred to a DSP through a transfer section.

11 Claims, 7 Drawing Sheets

FIG. 7

| MODULES | | |
|---|---|---|
| EFFECT MODULE | 1. | REVERB |
| | 2. | EARLY REFLECTION |
| | 3. | ECHO(DELAY) |
| | 4. | PITCH SHIFTER |
| | 5. | CHORUS |
| | 6. | FLANGER |
| | 7. | SYMPHONIC |
| | 8. | SURROUND |
| | 9. | VOICE CANCEL |
| | 10. | AUTO PAN |
| | 11. | PHASER |
| | 12. | DISTORTION |
| | 13. | FILTER |
| | 13d. | DYNAMIC FILTER |
| | 14. | PARAMETRIC EQ |
| | 15. | MIXER2, MIXER3,<br>MIXER4, MIXER6, MIXER8 |
| I/O MODULE | 1. | INPUT |
| | 2. | OUTPUT |

DSP PROGRAMMING APPARATUS AND DSP DEVICE

BACKGROUND OF THE INVENTION

The invention relates to a DSP (digital signal processing) programming apparatus used for processing audio signals such as musical sound signals as well as to a DSP device for storing DSP microprograms in executable form prepared by the DSP programming apparatus.

A DSP device (hereinafter referred to as "the DSP" where applicable) is used for high-speed digital processing of audio and video signal data. Programming for such high-speed digital processing is usually done using an assembly language that is very close to the DSP hardware.

Because the DSP itself is a special logic operation device different from general-purpose CPUs, and the programming therefor can be done only by an assembly language that is very close to the hardware as described above, software engineers must familiarize themselves well with the DSP hardware for programming.

In addition, it is difficult to modularize algorithms, which has led to a problem that in the case of preparing a plurality of programs, each program, although using functionally common algorithms, must be coded throughout again.

SUMMARY OF THE INVENTION

The object of the invention is to provide a DSP programming apparatus capable not only of reducing work load for software engineers at the time of doing DSP programming but also of modularizing commonly usable algorithms, as well as to provide a DSP device capable of storing programs prepared by the DSP programming apparatus.

The invention is applied to a DSP programming apparatus that includes a module storage unit which stores a plurality of modules, each module being formed by modularizing audio signal processing algorithms per function.

Each module is formed of a DSP microprogram, and a desired module is selected by an input unit. The DSP programming apparatus further includes a control unit that combines a plurality of modules selected by the input unit, prepares a DSP microprogram in executable form from the combined modules, and further transfers the prepared DSP microprogram in executable form through a transfer unit.

The combination of the selected modules includes an operation for selecting graphic symbols corresponding to the modules on a display screen and an operation for connecting the selected graphic symbols and displaying the selected graphic symbols in connected form on the display screen. The DSP microprogram preparing operation includes an operation for giving a data communication program step to each of the read modules, the data communication program step being a program step for allowing data to be intercommunicated between the combined modules by using an input/output buffer within a DSP device.

The invention is also applied to the DSP device that includes: a logic operation section for subjecting an input signal to multiplying-adding operations; and a microprogram memory which store the DSP microprogram in executable form. A multiplying-addition operation temporary storage RAM arranged in the logic operation section has a storage capacity of as many words as program steps storable in the microprogram memory, and allots the input/output buffer used by the data communication program steps in part thereof.

At the time of doing a DSP programming by the DSP programming apparatus of the invention, an arbitrary module is read from the module storage unit by the input unit. That is, a necessary module is selected by the input unit from the audio signal data input section that consists of an input module, modules for imparting effects (such as a reverb effect for an audio signal) by subjecting signal data past the input module to delay, modulation, and other processing, and an output module for preparing output signal data. Then, a plurality of modules are combined, and a DSP microprogram is thereafter prepared in executable form from the combined modules by the control unit. The prepared DSP microprogram in executable form is transferred to the DSP, which is the target device, through the transfer unit.

The module combining operation out of the control operations is performed not only by displaying graphic symbols corresponding to the modules on a display screen, but also by connecting modules selected from the displayed graphic symbols by the input unit and displaying the selected modules in connected form on the display screen. Further, the operation of preparing a DSP microprogram in final executable form is performed by giving a data communication program step to each of the read modules, the data communication program step being a program step for allowing data to be intercommunicated between the combined modules by using the input/output buffer within the DSP device. As a result of these operations, data can be delivered from one module to another.

Still further, the DSP device of the invention is characterized as setting the storage capacity of the multiplying/adding operation temporary storage RAM to as many words as program steps storable in the DSP microprogram memory, the multiplying/adding operation temporary storage RAM being arranged in the logic operation section that subjects an input signal to multiplying/adding operations. In addition, the DSP device is characterized as allotting the input/output buffer used by the data communication program steps in such temporary RAM. As a result of this design, should all the program steps be the input/output instructions using the input/output buffer, there are no overlapping data in the buffer.

BRIEF DESCRIPTION OF THE DRAWINGS

FIG. 7 is a diagram showing exemplary modules used by the DSP programming apparatus;

DETAILED DESCRIPTION OF PREFERRED EMBODIMENTS

Figure 1:
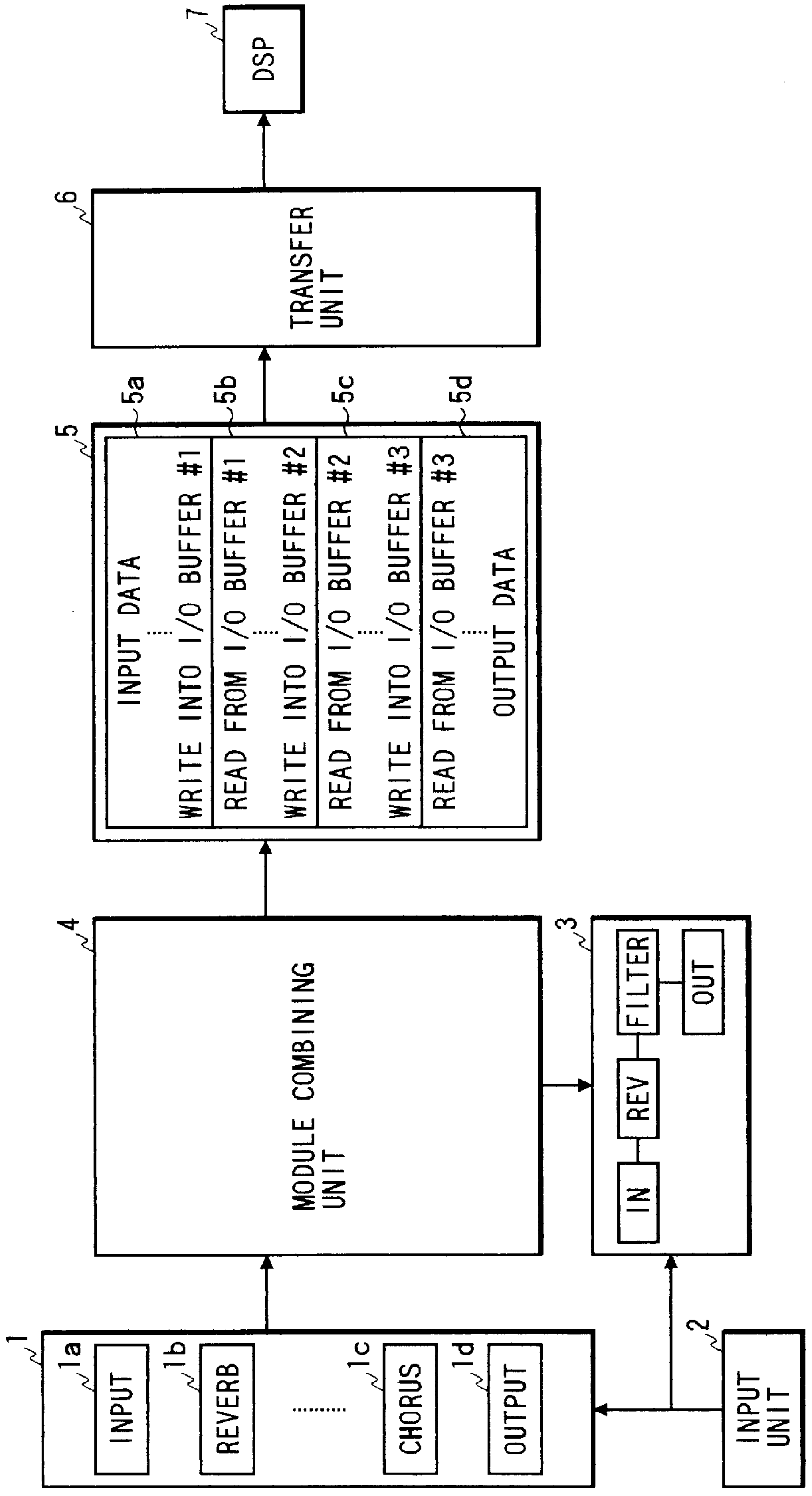
FIG. 1 is a schematic diagram showing a configuration of a DSP programming apparatus, which is an embodiment of the invention.

FIG. 1 shows a schematic configuration of a DSP programming apparatus, which is an embodiment of the invention.

In FIG. 1 reference numeral 1 denotes a module storage unit that stores a plurality of modules, each module being formed by modularizing audio signal processing algorithms per function. Each audio signal processing algorithm is a DSP microprogram. There are a plurality of modules for a predetermined function. The modules are: an input module 1*a* constituting a data input section for, e.g., temporarily storing input signal data; a reverb module 1*b* for imparting a reverb effect to the input signal data; a chorus module 1*c* for similarly imparting a chorus effect to the input signal data; and an output module 1*d* having an output buffer for, e.g., temporarily storing the signal data having various effects imparted. With respect to the type of module having the function of imparting an effect such as reverb, a plurality of modules are stored, so that at least one of such modules can be selected.

An input section 2 serves to select desired modules from the module storage unit 1. The selection can be made by a GUI (graphical user interface) function on a display screen 3. In the GUI function a plurality of modules are usually displayed on the screen in the form of graphic symbols (or the modules are displayed on the screen while read from a module file by the execution of an appropriate instruction), so that the user selects desired symbols using a pointing device such as a mouse and performs the operation of connecting the input/output ports of the selected symbols on the display screen 3 by continuously clicking the mouse. That is, it is by the click-and-drag operation with the mouse that the modules are selected, moved, and connected on the display screen. A module combining unit 4 links the plurality of modules connected on the display screen 3 by the GUI function so that the linked modules will correspond to predetermined algorithms that the DSP actually executes. A microprogram preparing section 5 prepares a DSP microprogram in executable form from the linked plurality of modules. It is in this microprogram preparing section 5 that a final program that is actually stored in the DSP is prepared. In the example shown in FIG. 1 a DSP microprogram in executable form is prepared by combining four modules. The program steps for data communication are interposed between modules. For example, a program step for writing data to address #1 of an I/O buffer is placed at the last address of a DSP microprogram 5*a* corresponding to the first module, and a program step for reading the data from address #1 of the I/O buffer is placed at the first address of a next DSP microprogram 5*b*. Accordingly, the arrangement of program steps for data communication among DSP microprograms permits the linking of all the modules. It may be noted that the I/O buffer is allotted to a temporary storage RAM arranged in a logic operation section within the DSP as will be described later.

The DSP microprogram prepared in executable form by the microprogram preparing section 5 is transferred to a microprogram RAM of the DSP 7, which is the target device, through a transfer unit 6.

Figure 2:
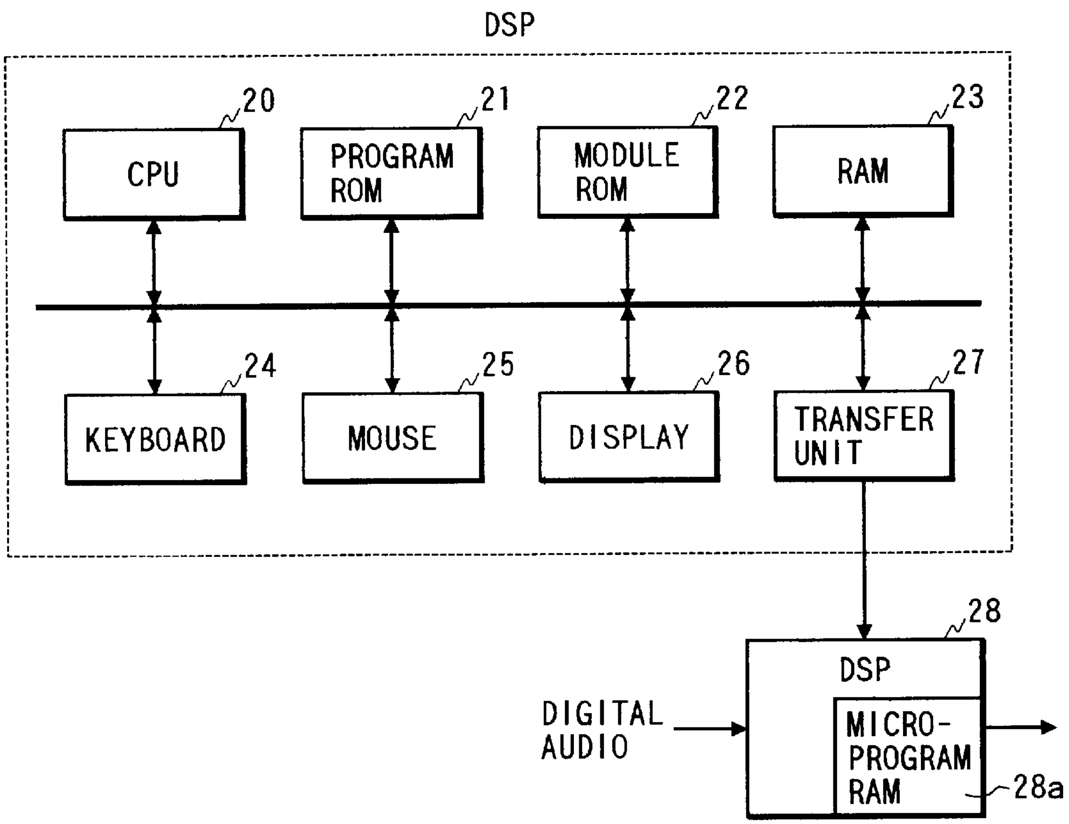
FIG. 2 is an actual block diagram of the DSP programming apparatus, which is the embodiment of the invention.

FIG. 2 shows an actual configuration of the DSP programming apparatus.

This apparatus includes: a CPU 20 for controlling the entire apparatus; a program ROM 21 for storing programs; a module ROM 22 for storing modules; a RAM 23 serving as a work area at the time of logic operation; a keyboard 24 and a mouse 25 serving as input means; a display 26; and a transfer unit 27 for transferring a DSP microprogram in executable form prepared by the logic operation to the DSP. The DSP 28, which is the target device, is connected to the transfer section 27. Within the DSP 28 is a microprogram RAM 28*a* that stores the transferred DSP microprogram in executable form.

Figure 3:
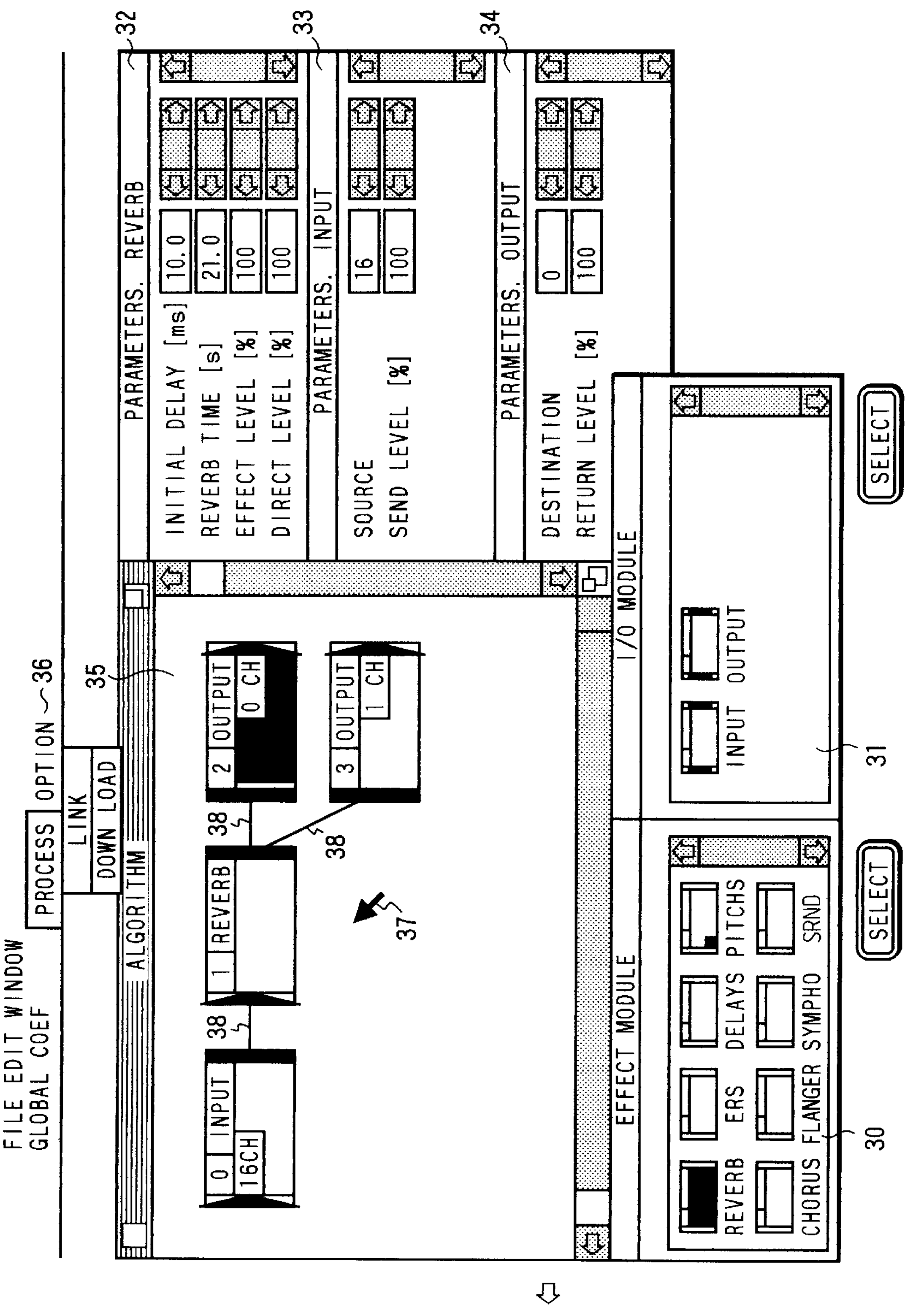
FIG. 3 is a diagram showing an exemplary display screen of the DSP programming apparatus.

FIG. 3 shows a display screen of the display 26 of the DSP programming apparatus.

The display screen of this display 26 can visually presents a plurality of windows. Referring to FIG. 3, at the lower part of the screen are a group of effect modules for imparting effects and a group of I/O modules displayed in the form of graphic symbols (icons) in their symbol windows 30, 31. At the upper right of the screen are windows 32 to 34 for setting parameters of the respective modules. At the upper left of the screen is an algorithm window 35 for combining the modules. Further, on top of the screen is a pull-down menu 36, which allows the operator to select and move desired icons (modules) by moving a cursor 37 and clicking and dragging the mouse. Furthermore, the operator can input a command by selecting the pull-down menu or a parameter by selecting a parameter input area and inputting the parameter through numeric keys.

In the example shown in FIG. 3, the reverb icon (module) is selected (by clicking the mouse) from the group of the effect modules at the lower left of the display screen, and the select button is pressed so that the reverb icon is transferred to the algorithm window 35; further, the input module is selected once and the output module is selected twice from the group of the I/O modules and are transferred to the algorithm window 35; still further, the connecting operation is performed (lines 38 are drawn for the connection) by continuously clicking the mouse at ends of these icons (the ends being parts corresponding to I/O ports) within the window 35. Two commands, a “Link” command and a “Down Load” command, are arranged in an item “Process” of the pull-down menu 36. When the “Link” command is specified by the cursor 37, the operation of linking (combining) the connected modules within the algorithm window 35 is performed to generate a DSP microprogram in executable form. When the “Down Load” command is specified, the DSP microprogram converted into executable form is transferred to the externally connected DSP 28.

Figure 4:
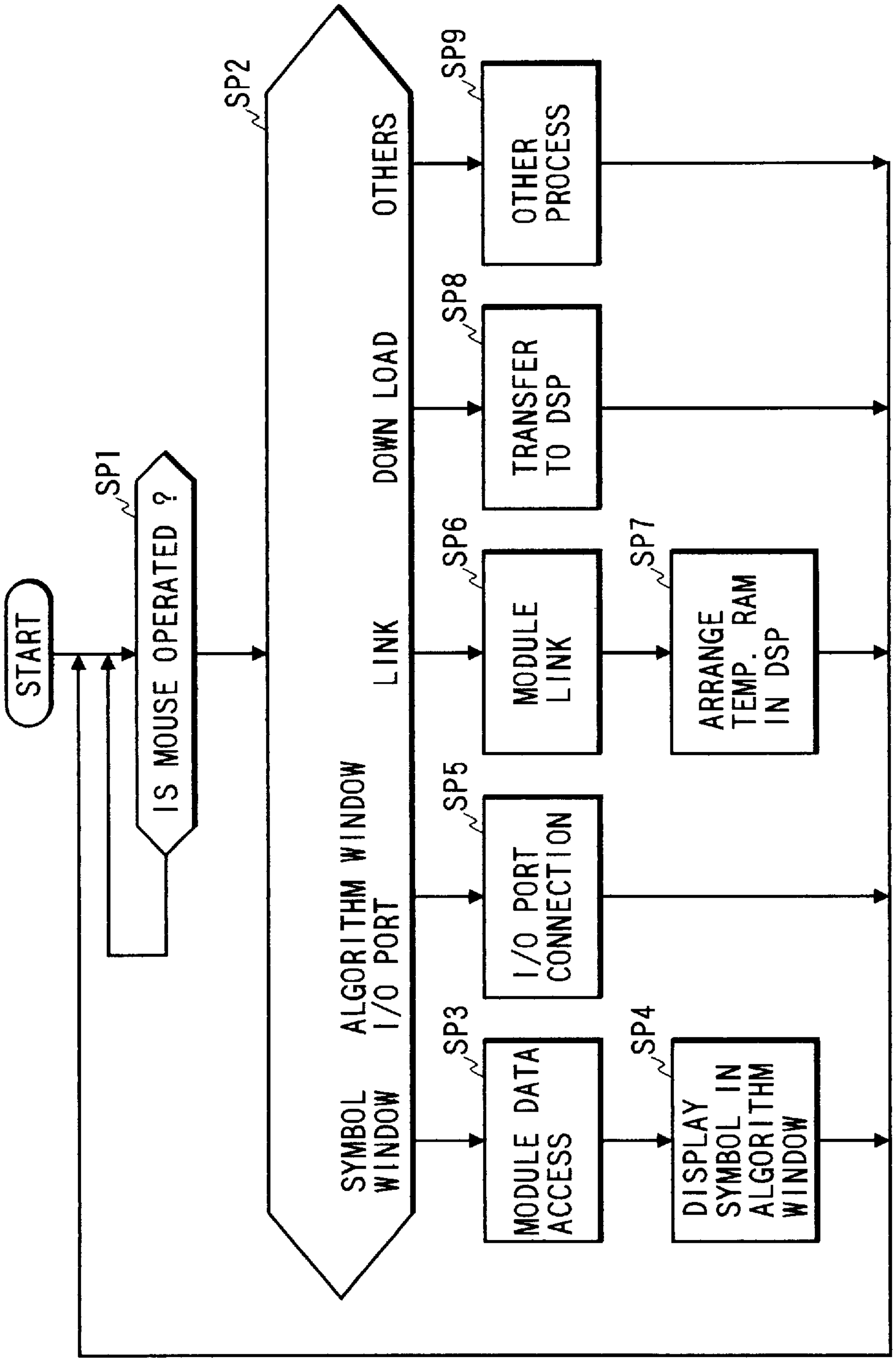
FIG. 4 is a flowchart showing a main operation of the DSP programming apparatus.

FIG. 4 is a flowchart showing a main operation of the DSP programming apparatus.

Upon detection of a mouse event in Step SP1, the content of the event is judged in SP2. If the mouse event is judged to be an operation within the symbol window 30 or 31, the module ROM 22 is accessed (SP3), and the icon of the specified module is displayed on the algorithm window 35 (SP4). If the mouse event is judged to be an operation for connecting the I/O ports of the modules on the algorithm window 35, the operation of connecting these ports by the lines 38 is performed (SP5). Further, when the mouse event is judged to be an operation for specifying the “Link”command in the pull-down menu, the operation of linking the modules displayed on the algorithm window 35 in connected form is performed (SP6), and an operation for arranging a temporary storage RAM (TEMP.RAM) within the DSP is further performed (SP7). The TEMP.RAM arranging operation is to place a program step for data communication between linked modules at the first and/or the last address of each DSP microprogram.

Figure 5:
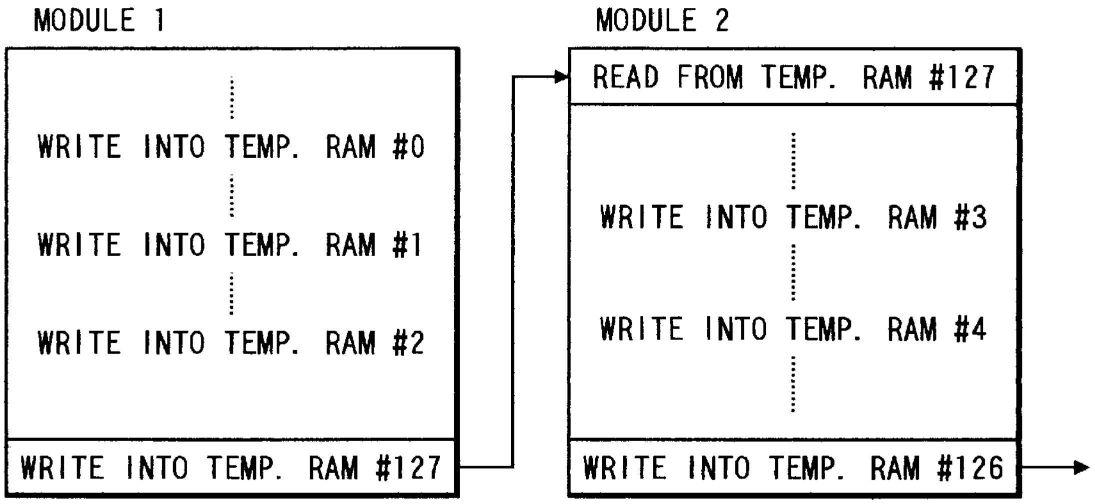
FIG. 5 is a diagram showing part of a DSP microprogram in executable form in which modules are linked.
Figure 6:
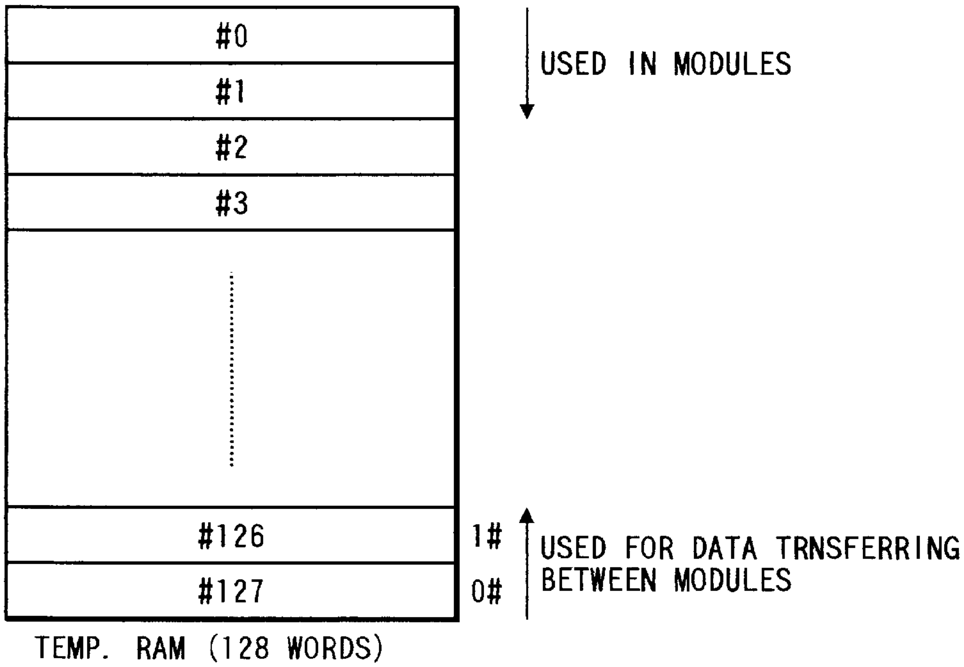
FIG. 6 is a diagram illustrative of the allotment of a TEMP.RAM area within a DSP device.

That is, as shown in FIG. 5, e.g., it is supposed to combine a module 1 with a module 2. A program step for writing output data of the module 1 to an address #127 of TEMP.RAM is placed at the last address of the module 1, and a program step for reading the data at the address #127 is placed at the first address of the module 2. Here the TEMP.RAM arranged in the DSP 28 has a storage capacity of 128 words, which is as many words as program steps storable in the microprogram RAM 28*a*. For inter-module data communication program steps in SP7, the TEMP.RAM area is designed to be used from address #127 to address #0 in the descending order as shown in FIG. 6. In contrast thereto, for intra-module writing or reading instructions, the TEMP.RAM area is used from address #0 to address #127 in the ascending order as shown in FIG. 6. As a result of this design, should all the program steps in the microprogram RAM 28*a* within the DSP use up all the TEMP.RAM area, there are no overlapping parts of the TEMP.RAM area used for the respective program steps. That is, the use of the TEMP.RAM area in this way prevents program steps from colliding with each other.

Upon completion of the aforementioned operation, the DSP microprogram in executable form which is to be transferred to the DSP 28 is stored in a predetermined area of the RAM 23 within the DSP programming apparatus. Upon selection of the "Down Load" command at this stage, the DSP microprogram in executable form is transferred to the microprogram RAM 28*a* of the DSP 28 (SP8).

It may be noted that exemplary effect modules and I/O modules are shown in FIG. 7. These modules are function modules independent of one another. A standardized I/O format is prepared for these modules. The effect modules are used together with the I/O modules. In this case, a plurality of effect modules can be used with ease, and may be combined in series or in parallel with one another.

Figure 8:
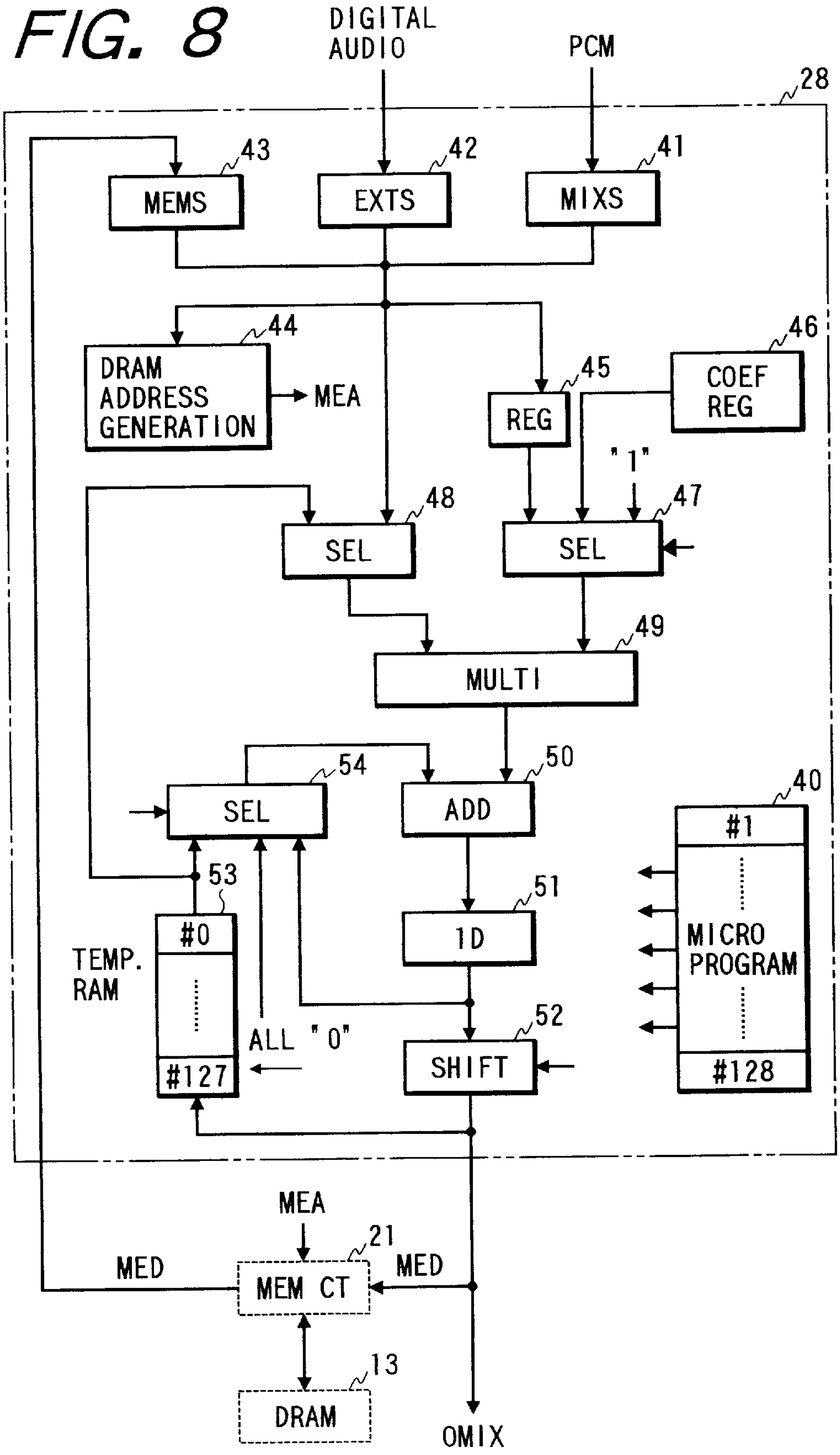
FIG. 8 is a specific block diagram of the DSP device.

FIG. 8 shows a specific block diagram of the DSP 28. In an actual application, a DRAM 13, which is an external storage device, is connected to the DSP 28 through a memory controller 21. Input data are PCM data and digital audio signal data, and these PCM and digital audio data are inputted to registers 41 and 42, respectively. Data from the DRAM 13 is inputted to a register 43. Any one of the data inputted to these registers is selected by a selector 48, and is multiplied at a multiplier 49 by a coefficient selected by a selector 47 out of a coefficient inputted from a coefficient register 46, a coefficient set to a register 45, and "1". The product is further subjected to multiplication-addition operation by a multiplier-adder circuit formed by combining an adder 50, a delay circuit 51, a selector 54, a shift circuit 52, a TEMP.RAM 53, and the like with the multiplier 49, and is thereafter subjected to audio signal processing based on predetermined algorithms in accordance with a DSP microprogram in executable form stored in a microprogram storage RAM 40.

Here the microprogram storage RAM 40 stores a DSP microprogram in executable form transferred from the DSP programming apparatus in an amount of as many as 128 program steps, and the TEMP.RAM 53 arranged in the logic operation section has a storage area that is as large as 128 words from address #0 to address #127. The TEMP.RAM area can be used for DSP microprogram instructions. That is, as shown in FIGS. 5 and 6, the TEMP.RAM 53 area is used for writing or reading instructions in respective modules. In this case, as shown in FIG. 6, the TEMP.RAM area is used for intra-module instructions from address #0 in the ascending order, whereas the TEMP.RAM area is used for inter-module data communication program steps from address #127 in the descending order. As a result of this design, even if all other program steps (128 program steps) including data communication program steps are data writing or reading instructions, there are no overlapping addresses for instructions in the TEMP.RAM area. That is, conflict between addresses can be prevented.

It may be noted that modules are freely added or modified later as long as the I/O format thereof and the like are defined. Therefore, such a "what-if" analysis as checking the imparted effects by outputting actual sound with the DSP connected to the DSP programming apparatus, modifying the DSP microprogram in executable form immediately after, and then checking again the newly imparted effects by outputting the actual sound can be made with extreme ease.

The invention is characterized as simplifying DSP programming through the GUI environment, so that software engineers with little knowledge of the DSP hardware can do the programming. In addition, the module storage unit having modules stored per function can dispense with the conventional coding operation per program, which in turn allows a desired DSP microprogram in executable form to be obtained only by linking best suited modules corresponding to algorithms.

Further, there are no overlapping addresses specified by program steps in the temporary storage RAM arranged in the logic operation section even if the DSP microprograms in executable form prepared by the DSP programming apparatus are directly stored in the DSP, which in turn ensures reliable operation.

What is claimed is:

1. A DSP programming apparatus comprising:

a module storage means for storing a plurality of modules, each module being formed by modularizing audio signal processing algorithms per function, each audio signal processing algorithm being a DSP microprogram;

an input means for selecting desired modules from said module storage means and for indicating a selected order for the selected modules;

a transfer means for transferring a complete DSP microprogram to an externally connected DSP device; and control means, the control means including:

means for statically linking the modules selected by the input means in the order selected by the input means by reading the modules stored in the module storage means on a module basis;

means for preparing a complete DSP microprogram in executable form corresponding to predetermined algorithms from the linked modules; and means for transferring the prepared complete DSP microprogram in executable form to the DSP device through the transfer means.

2. The DSP programming apparatus as defined in claim 1, further comprising:

a display means for graphically displaying functions of said plurality of modules, wherein the means for linking in the control means includes:

means for displaying graphic symbols corresponding to the modules on the display means; and means for connecting modules selected from the displayed graphic symbols by the input means and displaying the selected modules in connected form on the display means in accordance with the order selected by the input means, and the means for preparing a DSP microprogram in the control means includes means for adding a data communication program step to each module of the linked modules, the data communication program step being a program step for allowing data to be intercommunicated between the linked modules by using an input/output buffer within the DSP device.

3. The DSP programming apparatus as defined in claim 1, wherein said plurality of modules stored in said module storage means includes:

an input module constituting a data input section for temporarily storing input signal data;

a reverb module for imparting a reverb effect to the input signal data;

a chorus module for imparting a chorus effect to the input signal data; and an output module having an output buffer for temporarily storing output signal data.

4. A DSP device comprising:

a logic operation section for subjecting an input signal to multiplying/adding operations; and a microprogram storage means for storing a complete DSP microprogram in executable form, the complete DSP microprogram being prepared by a DSP programming apparatus by statically linking audio signal processing algorithm modules, the modules being linked such that inter-module data communication program steps are included in the prepared complete DSP microprogram, wherein said logic operation section includes a temporary storage RAM for storing results of the multiplying/adding operations, and the temporary storage RAM is used as an input/output buffer by the inter-module data communication program steps of the DSP microprogram.

5. The DSP device as defined in claim 4, wherein said DSP programming apparatus comprises:

a module storage means for storing a plurality of audio signal processing algorithm modules, each module being formed by modularizing audio signal processing algorithms per function, each audio signal processing algorithm being a DSP microprogram;

an input means for selecting desired modules from said module storage means;

a transfer means for transferring a complete DSP microprogram to the DSP device; and control means, the control means including:

means for statically linking the modules selected by the input means by reading the modules stored in the module storage means on a module basis;

means for preparing a complete DSP microprogram in executable form corresponding to predetermined algorithms from the linked modules; and means for transferring the prepared complete DSP microprogram in executable form to the DSP device through the transfer means.

6. The DSP programming apparatus as defined in claim 1, wherein the means for preparing a DSP microprogram in the control means includes means for adding a data communication program step to each module of the linked modules, the data communication program step being a program step for allowing data to be intercommunicated between the linked modules by using an input/output buffer within the DSP device.

7. The DSP device as defined in claim 4, wherein the means for preparing a DSP microprogram in the control means includes means for adding a data communication program step to each module of the linked modules, the data communication program step being a program step for allowing data to be intercommunicated between the linked modules by using an input/output buffer within the DSP device.

8. The DSP device as defined in claim 4, wherein the temporary storage RAM has a storage capacity of as many words as program steps storable in the microprogram storage means.

9. The DSP device as defined in claim 8, wherein said DSP programming apparatus comprises:

a module storage means for storing a plurality of audio signal processing algorithm modules, each module being formed by modularizing audio signal processing algorithms per function, each audio signal processing algorithm being a DSP microprogram;

an input means for selecting desired modules from said module storage means;

a transfer means for transferring a complete DSP microprogram to the DSP device; and control means, the control means including:

means for statically lining the modules selected by the input means by reading the modules stored in the module storage means on a module basis;

means for preparing a complete DSP microprogram in executable form corresponding to predetermined algorithms from the linked modules; and means for transferring the prepared complete DSP microprogram in executable form to the DSP device through the transfer means.

10. The DSP device as defined in claim 4, wherein the modules are linked by the DSP programming apparatus such that the inter-module data communication program steps are interposed between the modules in the prepared DSP microprogram.

11. The DSP device as defined in claim 5, wherein the modules are linked by the DSP programming apparatus such that the inter-module data communication program steps are interposed between the modules in the prepared DSP microprogram.

* * * * *